US008502619B2

(12) United States Patent
Akagi

(10) Patent No.: US 8,502,619 B2
(45) Date of Patent: Aug. 6, 2013

(54) CIRCUIT MODULE AND MEASUREMENT METHOD

(71) Applicant: Murata Manufacturing Co., Ltd, Nagaokakyo (JP)

(72) Inventor: Hidemori Akagi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/662,589

(22) Filed: Oct. 29, 2012

(65) Prior Publication Data

US 2013/0049879 A1 Feb. 28, 2013

Related U.S. Application Data

(63) Continuation of application No. PCT/JP2011/059921, filed on Apr. 22, 2011.

(30) Foreign Application Priority Data

May 6, 2010 (JP) .................................. 2010-106626

(51) Int. Cl.
*H01P 1/36* (2006.01)
(52) U.S. Cl.
USPC ........................................................ 333/24.2
(58) Field of Classification Search
USPC .............................. 333/1.1, 24.2, 33, 32, 17.3
See application file for complete search history.

(56) References Cited

U.S. PATENT DOCUMENTS

| 7,071,776 | B2* | 7/2006 | Forrester et al. ............... 330/129 |
| 7,359,681 | B2* | 4/2008 | Cho ............................. 455/107 |
| 8,248,179 | B2* | 8/2012 | Takahashi .................... 333/24.2 |

| 2002/0017952 | A1 | 2/2002 | Nakai et al. |
| 2002/0086643 | A1* | 7/2002 | Leipala .......................... 455/80 |
| 2009/0255103 | A1 | 10/2009 | Hasegawa |

FOREIGN PATENT DOCUMENTS

| JP | 06-338731 A | 12/1994 |
| JP | 07-283615 A | 10/1995 |
| JP | 2002-057511 A | 2/2002 |
| JP | 2005-117500 A | 4/2005 |
| JP | 2008-236641 A | 10/2008 |
| JP | 2009-253831 A | 10/2009 |

OTHER PUBLICATIONS

Official Communication issued in International Patent Application No. PCT/JP2011/059921, mailed on Jul. 5, 2011.
"Microwave Circuit for Communication"; The Institute of Electronics, Information and Communication Engineers; Oct. 20, 1981; 2 pages; Tokyo, Japan.
Konishi; "Basics and Applications of Microwave Circuit"; Aug. 20, 1992; 3 pages; Tokyo, Japan.

* cited by examiner

*Primary Examiner* — Stephen Jones
(74) *Attorney, Agent, or Firm* — Keating & Bennett, LLP

(57) ABSTRACT

A circuit module and a measurement method enable accurate measurement of isolation characteristics of an isolator. The circuit module includes a processing circuit including SAW filters and a power amplifier and performs certain processing on an input signal. An isolator includes an input port, an output port and a ground port and outputs an input signal, which is input thereto via the input port and on which the processing circuit has performed the certain processing, as an output signal via the output port. A directional coupler distributes a signal transmitted between the processing circuit and the isolator. A measurement instrument inputs a test signal from the output port and measures a detection signal output from the directional coupler.

20 Claims, 11 Drawing Sheets

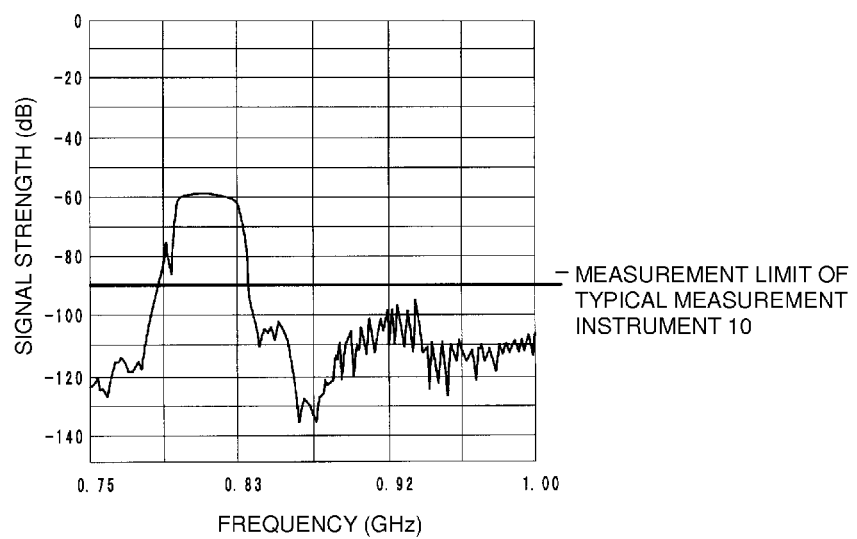

CIRCUIT MODULE AND MEASUREMENT METHOD

BACKGROUND OF THE INVENTION

1. Field of the Invention

The present invention relates to circuit modules and measurement methods and more specifically relates to circuit modules that include a processing circuit and an isolator and measurement methods.

2. Description of the Related Art

A composite electronic component described in Japanese Unexamined Patent Application Publication No. 2005-117500 is a known example of a conventional circuit module. The composite electronic component described in Japanese Unexamined Patent Application Publication No. 2005-117500 includes a power amplifier and an isolator. The isolator is provided downstream of the power amplifier and plays the role of preventing a signal from entering the power amplifier in a reverse direction.

In the case of the above-described composite electronic component, at the time of manufacture, the electrical characteristics of the isolator are adjusted while measuring the large signal characteristics of the composite electronic component serving as a power amplifier in order to make the measured values of the isolator become desired values. Thus, desired electrical characteristics are obtained for the isolator.

However, there is a problem with the composite electronic component described in Japanese Unexamined Patent Application Publication No. 2005-117500 in that the isolation characteristics of the isolator cannot be accurately measured while the isolator is being used inside the composite electronic component. In more detail, measurement of the isolation characteristics of the isolator is performed by inputting a test signal from an output port of the isolator and measuring an output signal output from an input port of the isolator. However, in the above-described composite electronic component, since the power amplifier and the isolator are connected to each other, a test signal is input from an output port of the isolator and an output signal is measured from an input signal of the power amplifier. Consequently, the isolation characteristics of the composite electronic component and the isolation characteristics of the isolator are superposed on top of one another. Thus, in the composite electronic component described in Japanese Unexamined Patent Application Publication No. 2005-117500, there is a concern that the isolation characteristics of only the isolator cannot be measured.

SUMMARY OF THE INVENTION

Accordingly, preferred embodiments of the present invention provide a circuit module including a processing circuit and an isolator, and a measurement method with which accurate measurement of the isolation characteristics of the isolator is performed.

A circuit module according to a preferred embodiment of the present invention includes a circuit board, a processing circuit provided on the circuit board and performing certain processing on an input signal, an isolator that is provided on the circuit board and includes an input port, an output port and a ground port, and that outputs the input signal, which is input thereto via the input port and on which the processing circuit has performed the certain processing, as an output signal via the output port, and a distribution circuit that is provided between the processing circuit and the isolator, and that distributes the input signal transmitted between the processing circuit and the isolator. The isolator includes a core isolator and a matching circuit. The core isolator is mounted on the circuit board and includes a ferrite, a permanent magnet that applies a direct current magnetic field to the ferrite, a first central electrode that is provided on the ferrite, has one end thereof connected to the input port and has another end thereof connected to the output port, and a second central electrode that is arranged on the ferrite so as to intersect the first central electrode while being insulated from the first central electrode, has one end thereof connected to the output port and has another end thereof connected to the ground port. The matching circuit is arranged on the circuit board to match an input impedance and an output impedance of the isolator to a certain impedance.

A measurement method according to another preferred embodiment of the present invention is a method for measuring the characteristics of an isolator of a circuit module, the circuit module including a processing circuit that performs certain processing on an input signal, the isolator, which includes an input port, an output port and a ground port and outputs an input signal, which is input thereto via the input port and on which the certain processing has been performed by the processing circuit, as an output signal via the output port, and a distribution circuit that is provided between the processing circuit and the isolator and distributes a signal transmitted between the processing circuit and the isolator, the method including a first step of inputting a test signal from the output port and measuring a detection signal output from the distribution circuit.

With various preferred embodiments of the present invention, for a circuit module including a processing circuit and an isolator, the isolation characteristics of the isolator can be accurately measured.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a graph in which the isolation characteristics of the SAW filters, the power amplifier and the isolator are added together.

DETAILED DESCRIPTION OF THE PREFERRED EMBODIMENTS

Hereafter, a circuit module and a measurement method according to preferred embodiments of the present invention will be described with reference to the drawings.

Figure 1:
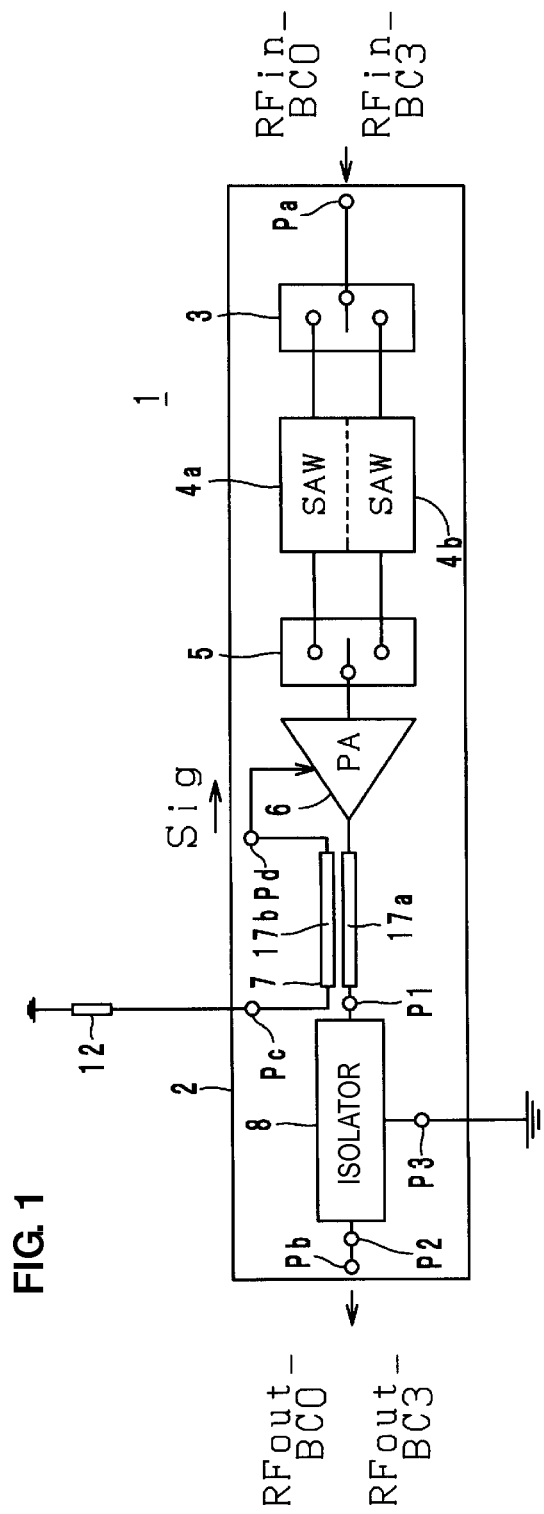
FIG. 1 is a block diagram of a circuit module according to a preferred embodiment of the present invention.

First, the structure of a circuit module will be described with reference to the drawings. FIG. 1 is a block diagram of a circuit module 1 according to a preferred embodiment of the present invention.

The circuit module 1 preferably defines a portion of a transmission circuit of a wireless transmitter of a cellular phone or the like and amplifies and outputs a high-frequency signal. The circuit module 1 includes a circuit board 2, a switch 3, SAW filters 4a and 4b, a switch 5, a power amplifier 6, a directional coupler 7 and an isolator 8.

The circuit board 2 preferably is a plate-shaped printed multilayer board on a surface of which and inside of which an electrical circuit is provided. The circuit board 2 is provided with terminals Pa to Pd. An input signal RFin_BCO (800 MHz band) or an input signal RFin_BC3 (900 MHz band) is input via the terminal Pa and an output signal RFout_BCO (800 MHz band) or an output signal RFout_BC3 (900 MHz band) is output via the terminal Pb, for example. The switch 3, the SAW filters 4a and 4b, the switch 5, the power amplifier 6, the directional coupler 7 and the isolator 8 are electronic components that are mounted on the circuit board 2 as illustrated in FIG. 1.

The switch 3 is connected to the terminal Pa and the SAW filters 4a and 4b as illustrated in FIG. 1. The switch 3 switches between outputting the input signal RFin_BCO and the output signal RFout_BC3 input via the terminal Pa to each of the SAW filters 4a and 4b.

The SAW filter 4a preferably is a band pass filter that has a characteristic of only allowing a high-frequency signal of a certain frequency band (for example, 800 MHz to 830 MHz) to pass therethrough. In addition, the SAW filter 4b preferably is a band pass filter that has a characteristic of only allowing a high-frequency signal of a certain frequency band (for example, 880 MHz to 920 MHz), which is different to that of the SAW filter 4a, to pass therethrough. In more detail, the SAW filters 4a and 4b have characteristics in which the attenuation of a pass signal within the certain frequency band is smaller than the attenuation of the pass signal outside the certain frequency band. The term "pass signal" refers to a high-frequency signal that has passed through the SAW filter 4a or 4b.

The switch 5, as illustrated in FIG. 1, is connected to the SAW filters 4a and 4b and the power amplifier 6, and outputs the input signal RFin_BCO or the input signal RFin_BC3 output from the SAW filter 4a or the SAW filter 4b to the power amplifier 6. The power amplifier 6 amplifies the power of the input signal RFin_BCO or the input signal RFin_BC3 output from the switch 5. Thus, the switch 3, the SAW filters 4a and 4b, the switch 5 and the power amplifier 6 function as a processing circuit that performs certain processing on the input signal RFin_BCO or the input signal RFin_BC3.

The isolator 8, as illustrated in FIG. 1, preferably is a non-reciprocal circuit element having an input port P1, an output port P2 and a ground port P3. Specifically, the isolator 8 outputs an input signal that has been input via the input port P1 and been subjected to certain processing by the processing circuit as an output signal via the output port P2. On the other hand, the isolator 8 does not output a high-frequency signal reflected from the terminal Pb side to the power amplifier 6 side. Therefore, the output port P2 is connected to the terminal Pb and the ground port P3 is grounded. The isolator 8 will be described in detail below.

The directional coupler 7 is provided between the power amplifier 6 and the isolator 8 and is a distribution circuit that distributes an input signal transmitted between the power amplifier 6 and the isolator 8. In more detail, the directional coupler 7 includes a main line 17a and a sub-line 17b. The main line 17a and the sub-line 17b are electromagnetically coupled. The degree of coupling between the main line 17a and the sub-line 17b is, for example, about −8 dB. One end of the main line 17a is connected to the power amplifier and the other end of the main line 17a is connected to the input port P1 of the isolator 8. One end of the sub-line 17b is connected to the terminal Pc and the other end of the sub-line 17b is connected to the power amplifier 6 via the terminal Pd.

Here, the terminal Pc is grounded via a resistor 12 in order to achieve impedance matching. Thus, when an input signal is transmitted through the main line 17a, a portion of the input signal is distributed and output from the terminal Pd as a distributed signal Sig. The terminal Pd is connected to the power amplifier 6. Consequently, the distributed signal Sig is input to the power amplifier 6. The value of the distributed signal Sig changes with variation of an output signal of the power amplifier 6 and therefore in order to secure a certain value for the output signal of the power amplifier 6, the power amplifier 6 changes the amount of amplification for an input signal on the basis of the strength of the distributed signal Sig. Thus, the power amplifier 6 performs certain processing on an input signal.

Figure 2:
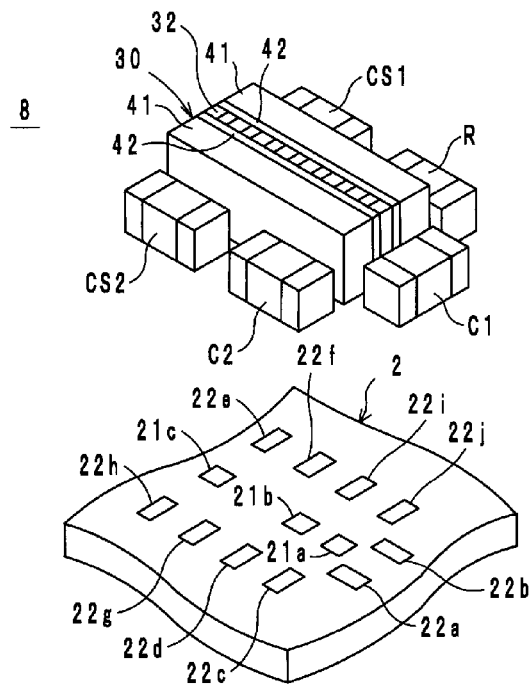
FIG. 2 is an external perspective view of an isolator.
Figure 3:
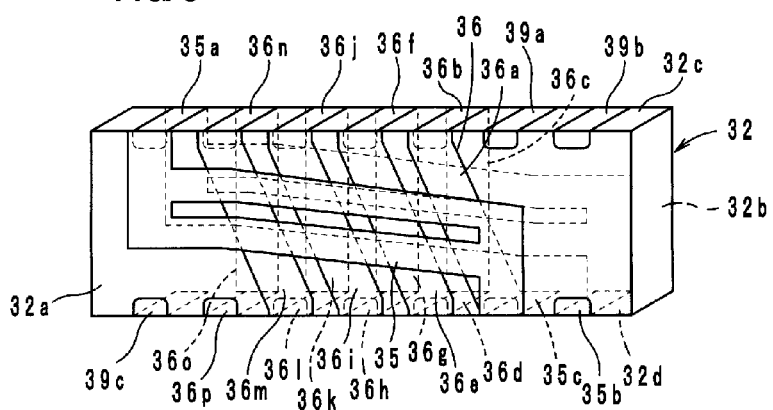
FIG. 3 is an external perspective view of a ferrite on which central electrodes have been provided.
Figure 4:
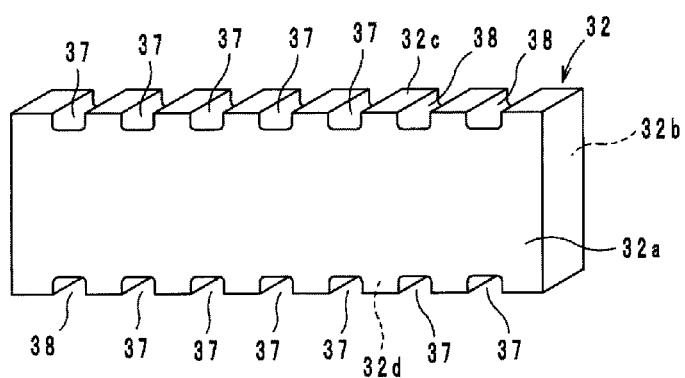
FIG. 4 is an external perspective view of a ferrite.
Figure 5:
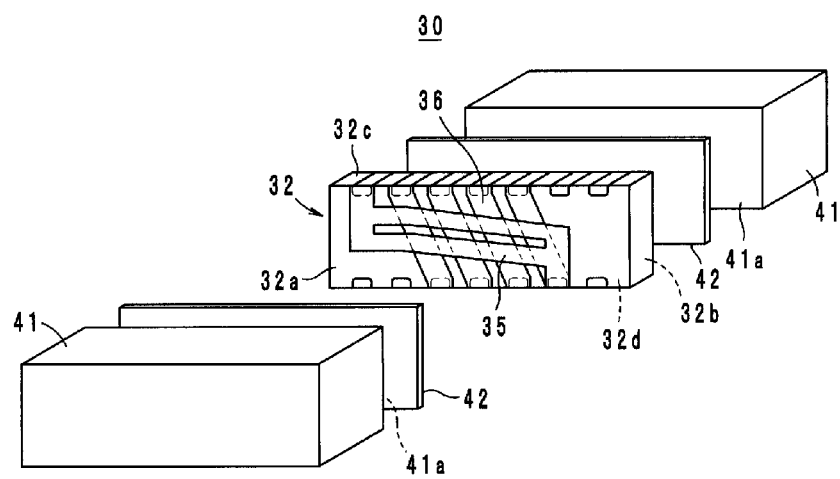
FIG. 5 is an exploded perspective view of a core isolator.

Next, the isolator 8 will be described with reference to the drawings. FIG. 2 is an external perspective view of the isolator 8. FIG. 3 is an external perspective view of a ferrite 32 on which central electrodes 35 and 36 have been provided. FIG. 4 is an external perspective view of the ferrite 32. FIG. 5 is an exploded perspective view of a core isolator 30.

The isolator 8 preferably is a lumped constant isolator and as illustrated in FIG. 2 includes the circuit board 2, the core isolator 30, capacitors C1, C2, CS1 and CS2 and a resistor R.

The core isolator 30, as illustrated in FIG. 2, preferably includes the ferrite 32 and a pair of permanent magnets 41. As illustrated in FIG. 3, the central electrodes 35 and 36, which are electrically isolated from each other, are provided on front and back main surfaces 32a and 32b of the ferrite 32. Here, the ferrite 32 preferably has a rectangular or substantially rectangular parallelepiped shape including the opposing parallel main surfaces 32a and 32b.

In addition, the permanent magnets 41 are adhered to the main surfaces 32a and 32b via an epoxy-based adhesive 42 so that a direct current magnetic field is applied to the ferrite 32 in a direction that is orthogonal or substantially orthogonal to the main surfaces 32a and 32b (refer to FIG. 5). The main surface 41a of each of the permanent magnets 41 preferably has the same or substantially the same dimensions as the main surfaces 32a and 32b of the ferrite 32. The ferrite 32 and the permanent magnets 41 are arranged so as oppose each other such that the outlines of the main surfaces 32a and 32b and the outlines of the main surfaces 41a coincide with each other.

The central electrode 35 preferably includes a conductive film. That is, as illustrated in FIG. 3, on the main surface 32a of the ferrite 32, the central electrode 35 is inclined at a comparatively small angle with respect to a top-left long edge while rising from the bottom right and branching into two segments. The central electrode 35 rises toward the top left and turns toward the main surface 32b via an intermediary electrode 35a on an upper surface 32c. In addition, the central electrode 35 is arranged so as to branch into two segments on the main surface 32b so as to be superposed with the segments thereof on the main surface 32a when viewed in a transparent manner. One end of the central electrode 35 is connected to a connection electrode 35b located on a lower surface 32d. Furthermore, the other end of the central electrode 35 is connected to a connection electrode 35c located on the lower surface 32d. Thus, the central electrode 35 is wound around the ferrite 32 through one turn. The central electrode 35 and the central electrode 36, which will be described below, intersect each other in such a manner that they are insulated from each other by insulating films provided therebetween. The angle of intersection of the central electrodes 35 and 36 is set as needed to adjust the input impedance and insertion loss.

The central electrode 36 preferably includes a conductive film. A 0.5th turn 36a of the central electrode 36 is located on the main surface 32a so as to be inclined from the bottom right toward the top left at a comparatively large angle with respect to long edges of the main surface 32a and so as to intersect the central electrode 35, and the 0.5th turn 36a turns towards the main surface 32b via an intermediary electrode 36b on the upper surface 32c, and a 1st turn 36c of the central electrode 36 is located on the main surface 32b so as to orthogonally or substantially orthogonally intersect the central electrode 35. A lower end portion of the 1st turn 36c turns toward the main surface 32a via an intermediary electrode 36d on the lower surface 32d, and a 1.5th turn 36e is arranged so as to intersect the central electrode 35 in parallel or substantially in parallel with the 0.5th turn 36a on the main surface 32a and turns toward the main surface 32b via an intermediary electrode 36f on the upper surface 32c. Thereafter, in a similar manner, a 2nd turn 36g, an intermediary electrode 36h, a 2.5th turn 36i, an intermediary electrode 36j, a 3rd turn 36k, an intermediary electrode 36l, a 3.5th turn 36m, an intermediary electrode 36n and a 4th turn 36o are formed on the surfaces of the ferrite 32. In addition, the two ends of the central electrode 36 are respectively connected to connection electrodes 35c and 36p located on the lower surface 32d of the ferrite 32. The connection electrode 35c is commonly used as a connection electrode for the end portions of the central electrode 35 and the central electrode 36.

In addition, the connection electrodes 35b, 35c and 36p and the intermediary electrodes 35a, 36b, 36d, 36f, 36h, 36j, 36l and 36n are provided by applying or filling an electrode conductor preferably composed of, for example, silver, a silver alloy, copper or a copper alloy into concavities 37 (refer to FIG. 4) formed in the upper surface 32c and the lower surface 32d of the ferrite 32. Furthermore, concavities 38 are also provided in the upper surface 32c and the lower surface 32d in parallel with the individual electrodes and dummy electrodes 39a, 39b and 39c are provided in these concavities. These individual electrodes are formed preferably by forming through holes in advance in a mother ferrite substrate and filling the through holes with an electrode conductor, and then performing cutting at positions at which the through holes are to be divided. The individual electrodes may be formed as conductor films in the concavities 37 and 38.

For example, YIG ferrite is used as the ferrite 32. The central electrodes 35 and 36 and the other individual electrodes can be formed as thick films or thin films of silver or a silver alloy by using a construction method such as printing, transference or photolithography. As insulating films for the central electrodes 35 and 36, dielectric thick films such as ones composed of glass or aluminum, or resin films such as ones composed of polyimide can preferably be used, for example. The insulating films can also be formed by using a process such as printing, transference or photolithography, for example.

The ferrite 32 including the insulating films and the individual electrodes can be fired in an integrated manner as a magnetic material. In this case, Pd, Ag or Pd/Ag, which is resistant to high temperature firing, is preferably used for the individual electrodes.

Generally, strontium-based, barium-based, lanthanum-cobalt-based ferrite magnets are used as the permanent magnets 41. As the adhesive 42 that adheres the permanent magnets 41 and the ferrite 32 to one another, use of a single liquid thermosetting epoxy adhesive is preferable.

The circuit board 2 is preferably composed of the same material as a typical printed circuit board, for example. Terminal electrodes 21a, 21b, 21c, and 22a to 22j to mount the core isolator 30, the capacitors C1, C2, CS1 and CS2, and the resistor R, input/output electrodes, ground electrodes (not illustrated) and so forth are provided on the surface of the circuit board 2.

The core isolator 30 is mounted on the circuit board 2. Specifically, along with the connection electrodes 35b, 35c and 36p of the lower surface 32d of the ferrite 32 being integrated with the terminal electrodes 21a, 21b and 21c on the surface of the circuit board 2 through reflow soldering, the lower surfaces of the permanent magnets 41 are integrated with the surface of the circuit board 2 through an adhesive, for example. In addition, the capacitors C1, C2, CS1 and CS2 and the resistor R are reflow soldered to the terminal electrodes 22a to 22j on the circuit board 2. The capacitors C1, C2, CS1 and CS2 and the resistor R function as a matching circuit to match the input impedance and the output impedance of the isolator 8 to a certain impedance (for example, about 50Ω).

Figure 6:
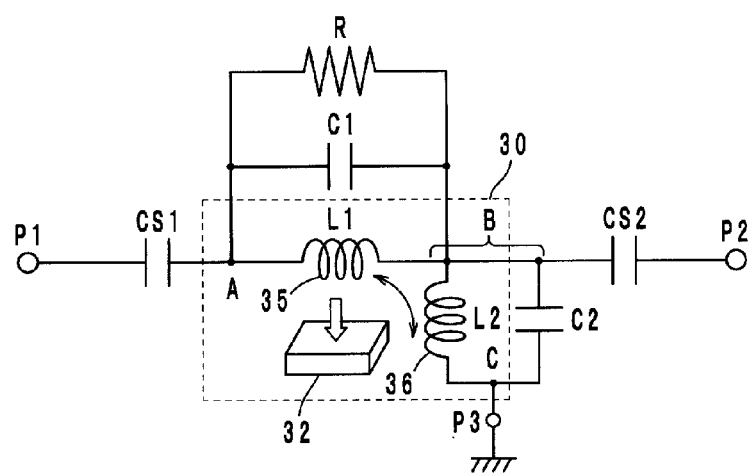
FIG. 6 is an equivalent circuit diagram of an isolator.

Next, the circuit configuration of the isolator 8 will be described with reference to the drawings. FIG. 6 is an equivalent circuit diagram of the isolator 8.

The input port P1 is connected to the capacitor C1 and the resistor R through the capacitor CS1. The capacitor CS1 is connected to one end of the central electrode 35. The other end of the central electrode 35 and one end of the central electrode 36 are connected to the resistor R and the capacitors C1 and C2 and are connected to the output port P2 via the capacitor CS2. The other end of the central electrode 36 and the capacitor C2 are connected to the ground port P3.

In the isolator 8 having the above-described circuit configuration, one end of the central electrode 35 is connected to the input port P1, the other end of the central electrode 35 is connected to the output port P2, one end of the central electrode 36 is connected to the output port P2 and the other end of the central electrode 36 is connected to the ground port P3. As a result, the isolator 8 can be a two-port lumped constant isolator having a small insertion loss. In addition, at the time of operation, a large high-frequency signal flows through the central electrode 36, whereas a high-frequency signal substantially does not flow through the central electrode 35.

Figure 7:
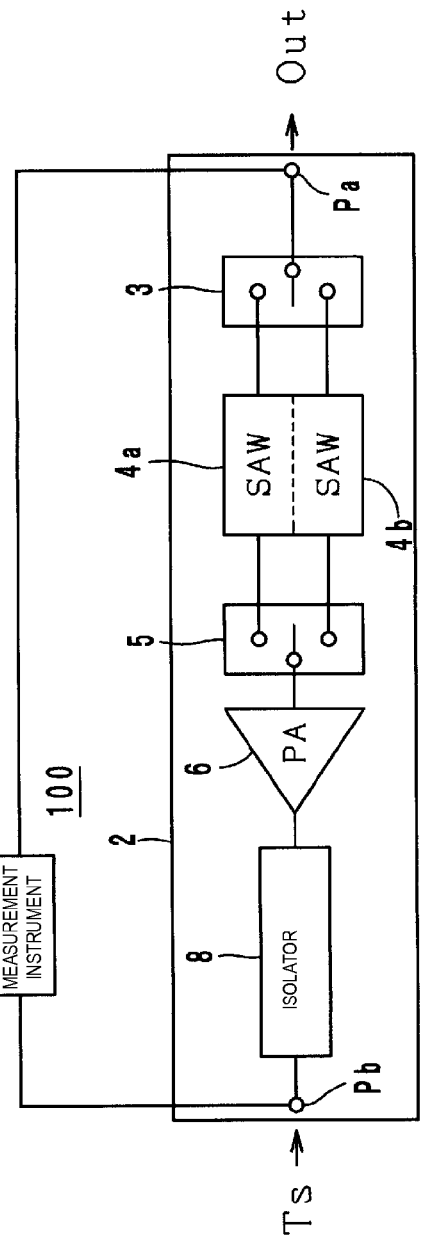
FIG. 7 is a block diagram of a conventional circuit module at the time when measurement of isolation characteristics of an isolator is being performed.
Figure 8A:
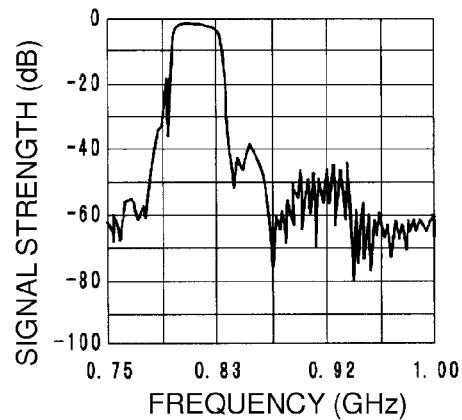
FIG. 8A is a graph illustrating isolation characteristics of SAW filters.
Figure 8B:
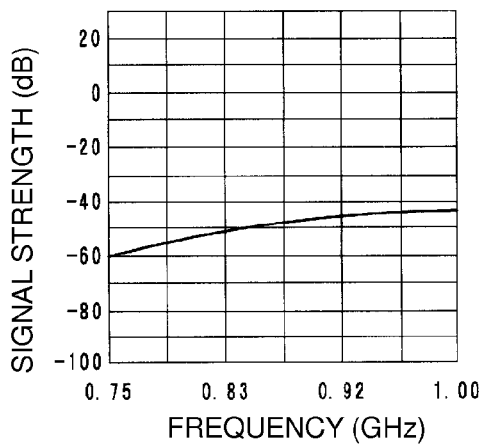
FIG. 8B is a graph illustrating isolation characteristics of a power amplifier.
Figure 8C:
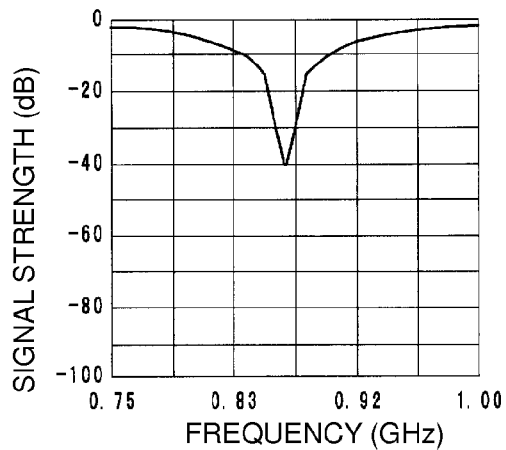
FIG. 8C is a graph illustrating isolation characteristics of an isolator.

Hereafter, a method of measuring the isolation characteristics of the isolator 8 in the thus-structured circuit module 1 will be described. First, a conventional circuit module will be described with reference to the drawings. FIG. 7 is a block diagram of a conventional circuit module 100 at the time when measurement of isolation characteristics of the isolator 8 is being performed. FIG. 8A is a graph illustrating isolation characteristics of the SAW filters 4a and 4b. FIG. 8B is a graph illustrating isolation characteristics of the power amplifier 6. FIG. 8C is a graph illustrating isolation characteristics of the isolator 8. FIG. 9 is a graph in which the isolation characteristics of the SAW filters 4a and 4b, the power amplifier 6 and the isolator 8 are added together. In FIGS. 8A-8C, the vertical axis represents signal strength and the horizontal axis represents frequency. In addition, the isolation characteristics are the attenuation characteristics when a high-frequency signal is input in the reverse direction to the SAW filters 4a and 4b, the power amplifier 6 and the isolator 8.

In the circuit module 100 illustrated in FIG. 7, the directional coupler 7 is not provided. Therefore, when measuring the isolation characteristics of the isolator 8, a measurement instrument 10 is connected between the terminals Pa and Pb. The measurement instrument 10 is a network analyzer and inputs a test signal Ts from the terminal Pb and measures a detection signal Out output from the terminal Pa. The test signal Ts is a signal having a strength equivalent to that of a signal in a frequency band of 750 MHz to 1 GHz. The measurement instrument 10 measures attenuation of the detection signal Out with respect to the test signal Ts at each frequency.

Here, the measurement instrument 10 is connected between the terminals Pa and Pb. Consequently, in the case where the measurement instrument 10 inputs a test signal Ts from the terminal Pb and measures a detection signal Out, the measurement instrument 10 measures the isolation characteristics of the SAW filters 4a and 4b, the power amplifier 6 and the isolator 8. The SAW filters 4a and 4b, the power amplifier 6 and the isolator 8 respectively have the isolation characteristics illustrated in FIG. 8A, FIG. 8B and FIG. 8C. Therefore, the measurement instrument 10, as illustrated in FIG. 9, obtains isolation characteristics that are the sum of the isolation characteristics of the SAW filters 4a and 4b, the power amplifier 6 and the isolator 8.

When the isolation characteristics are added together, as illustrated in FIG. 9, the attenuation of the detection signal Out with respect to the test signal Ts become large. In more detail, as illustrated in FIG. 8A, the SAW filter 4a has characteristics in which the attenuation of a pass signal within a certain frequency band (for example, 800 MHz to 830 MHz) is smaller than the attenuation of the pass signal outside the certain frequency band. In addition, although not illustrated, the SAW filter 4b has characteristics in which the attenuation of a pass signal in a certain frequency band (for example, 880 MHz to 920 MHz) is smaller than the attenuation of the pass signal outside the certain frequency band. In addition, the isolator 8 has isolation characteristics in which, as illustrated in FIG. 8C, when a first high-frequency signal is input from the output port P2, the attenuation of a second high-frequency signal, output from the input port P1 with respect to the first high-frequency signal, is maximum at a frequency (for example, 870 MHz) that is outside a certain frequency band. Consequently, when the isolation characteristics are added together, the attenuation of the detection signal Out with respect to the test signal Is at a frequency (for example, 870 MHz) outside a certain frequency band becomes particularly large. As a result, the output of the detection signal Out becomes smaller than the signal level that can be measured by the measurement instrument 10 and it becomes difficult to measure the detection signal Out using the measurement instrument 10. That is, it becomes difficult to measure the isolation characteristics of the isolator 8.

Figure 10:
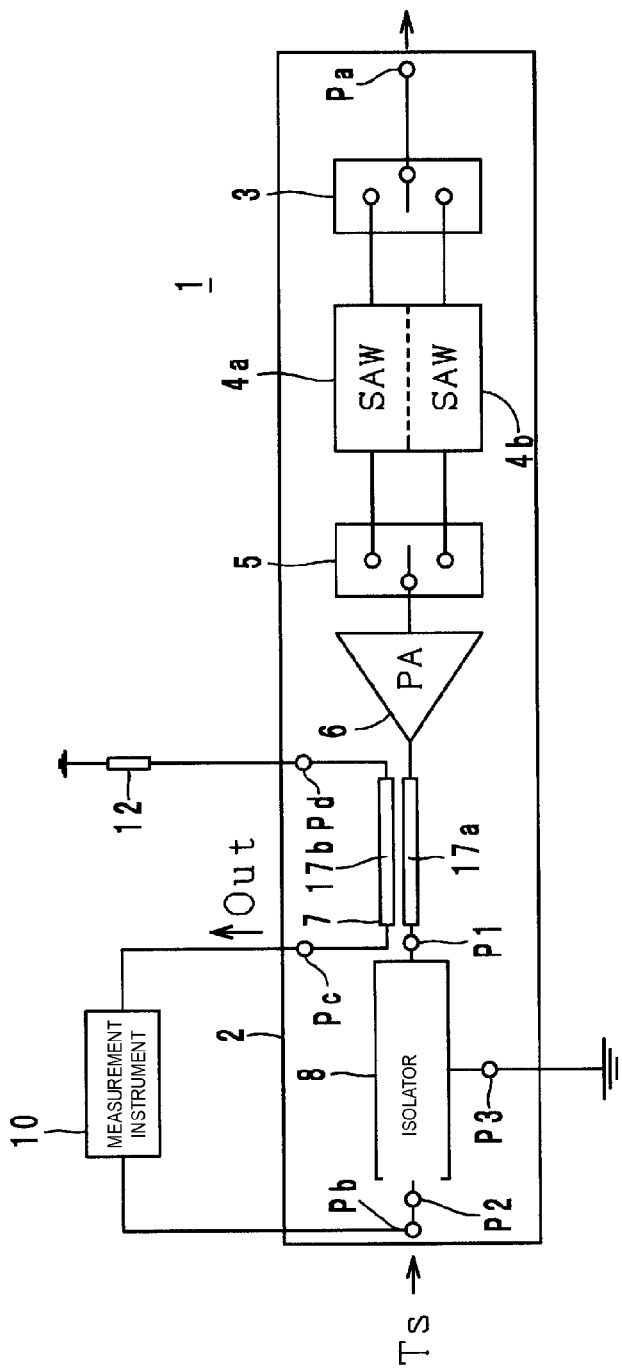
FIG. 10 is a block diagram of a circuit module at the time when measurement of isolation characteristics of an isolator is being performed.
Figure 11A:
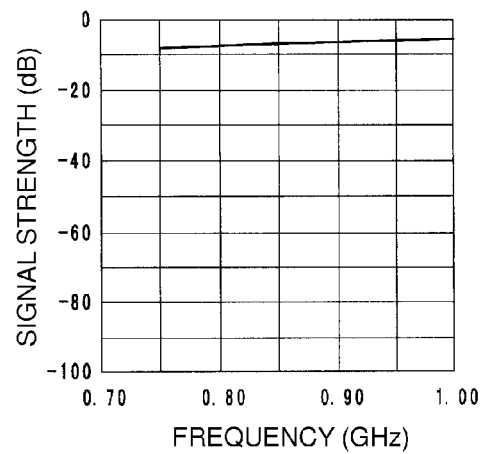
FIG. 11A is a graph illustrating isolation characteristics of a directional coupler.
Figure 11B:
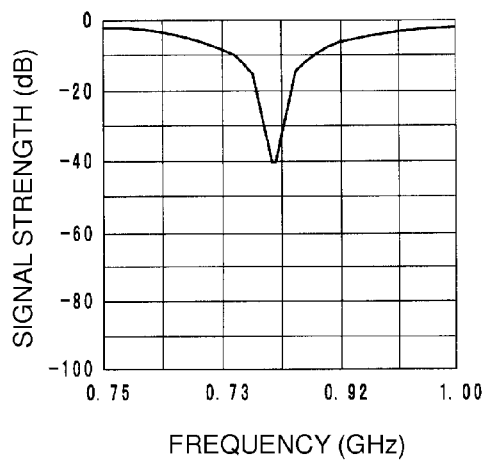
FIG. 11B is a graph illustrating isolation characteristics of an isolator.
Figure 12:
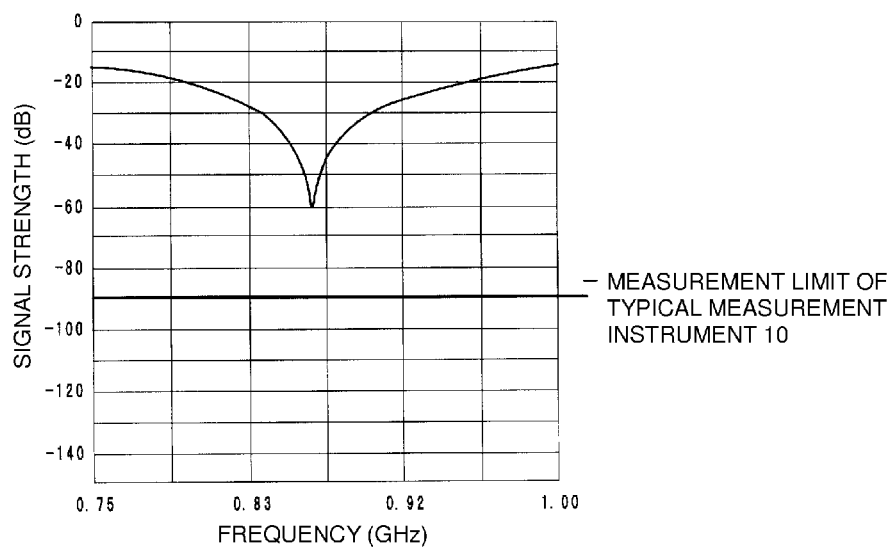
FIG. 12 is a graph in which the isolation characteristics of a directional coupler and an isolator are added together.

Accordingly, the directional coupler 7 is provided in the circuit module 1. FIG. 10 is a block diagram of the circuit module 1 at the time when measurement of the isolation characteristics of the isolator 8 is being performed. FIG. 11A is a graph illustrating isolation characteristics of the directional coupler 7. FIG. 11B is a graph illustrating the isolation characteristics of the isolator 8. FIG. 12 is a graph in which the isolation characteristics of the directional coupler 7 and the isolator 8 are added together. In FIGS. 11A and 11B, the vertical axis represents signal strength and the horizontal axis represents frequency.

In the circuit module 1 illustrated in FIG. 10, the directional coupler 7 is provided between the power amplifier 6 and the isolator 8. The directional coupler 7 preferably is a distribution circuit that distributes a high-frequency signal transmitted between the power amplifier 6 and the isolator 8. When measuring the isolation characteristics of the isolator 8, the measurement instrument 10 is connected between the terminals Pb and Pc and the terminal Pd is grounded via the resistor 12 to perform impedance matching. The measurement instrument 10 inputs a test signal Ts from the terminal Pb and measures a detection signal Out output from the directional coupler 7 via the terminal Pc. The test signal Ts is a signal having a strength equivalent to that of a signal in a frequency band of 750 MHz to 1 GHz. The measurement instrument 10 measures attenuation of the detection signal Out with respect to the test signal Ts at each frequency.

Here, the measurement instrument 10 is connected between the terminals Pb and Pc. Consequently, in the case where the measurement instrument 10 inputs a test signal Ts from the terminal Pb and measures a detection signal Out, the measurement instrument 10 measures the isolation characteristics of the directional coupler 7 and the isolator 8. The directional coupler 7 and the isolator 8 respectively have the isolation characteristics illustrated in FIGS. 11A and 11B. Therefore, the measurement instrument 10, as illustrated in FIG. 12, obtains isolation characteristics that are the sum of the isolation characteristics of the directional coupler 7 and the isolator 8.

However, as illustrated in FIGS. 8A, 8B, 11A and 11B, the directional coupler 7 has isolation characteristics having small attenuation compared with the SAW filters 4a and 4b and the power amplifier 6. Specifically, in the directional coupler 7, the attenuation of the detection signal Out with respect to the test signal Ts is −8 dB, whereas, in the SAW filters 4a and 4b and the power amplifier 6, the attenuation of the detection signal Out with respect to the test signal Ts is about −50 dB to about −60 dB. Therefore, in the circuit module 1, the detection signal Out can be more readily measured by the measurement instrument 10, compared with the circuit module 100. That is, in the circuit module 1, accurate measurement of the isolation characteristics of the isolator 8 can be readily performed.

After the detection signal Out is measured by the measurement instrument 10, the characteristics of the isolator 8 are adjusted on the basis of the results of measuring the detection signal Out. Methods of adjusting the characteristics of the isolator 8 include changing the magnetic flux density of the permanent magnets 41 of the isolator 8. In addition, characteristics of the isolator 8 include pass characteristics, isolation characteristics, input impedance and output impedance.

Therefore, the circuit module 1 is suitable for allowing measurement of the isolation characteristics of the isolator 8 including the core isolator 30. In more detail, a typical isolator is preferably formed by mounting a ferrite, a matching circuit and so forth on a small substrate. When the typical isolator is to be mounted on the circuit board 2, the small substrate, on which the ferrite and matching circuit have been mounted, is mounted on the circuit board 2. Therefore, the typical isolator preferably includes an isolator on a small substrate, prior to being mounted on the circuit board 2. Therefore, in the case where the isolation characteristics of the typical isolator are to be measured, the isolation characteristics may be measured by the measurement instrument 10 before mounting the isolator on the circuit board 2.

However, in the isolator 8 that includes the core isolator 30, the core isolator 30, the capacitors C1, C2, CS1 and CS2 and the resistor R are mounted on the circuit board 2. That is, the isolator 8 functions as an isolator from when the individual components are mounted on the circuit board 2. Therefore, for the isolator 8, measurement of the isolation characteristics before the isolator is mounted on the circuit board 2, as in the case of the typical isolator, cannot be performed.

Accordingly, in the circuit module 1 and the measurement method, the measurement of a high-frequency signal that has passed through only the isolator 8 is made possible by providing the directional coupler 7 between the power amplifier 6 and the isolator 8. As a result, in the circuit module 1, the isolation characteristics of just the isolator 8 can be measured accurately even after the isolator 8 has been mounted on the circuit board 2.

In addition, since the isolator 8 is arranged in the circuit module 1, the isolator 8 having isolation characteristics in which, when a first high-frequency signal is input from the output port P2 of the isolator 8, attenuation of a second high-frequency signal output from the input port P1 with respect to the first high-frequency signal is a maximum at a frequency (for example, 870 MHz) between a certain frequency band (for example, 800 MHz to 830 MHz) of the SAW filter 4a and a certain frequency band (for example, 880 MHz to 920 MHz) of the SAW filter 4b, which define a processing circuit, isolation characteristics can be accurately measured in the circuit module 1 having pass bands of a plurality of different signals.

Figure 13:
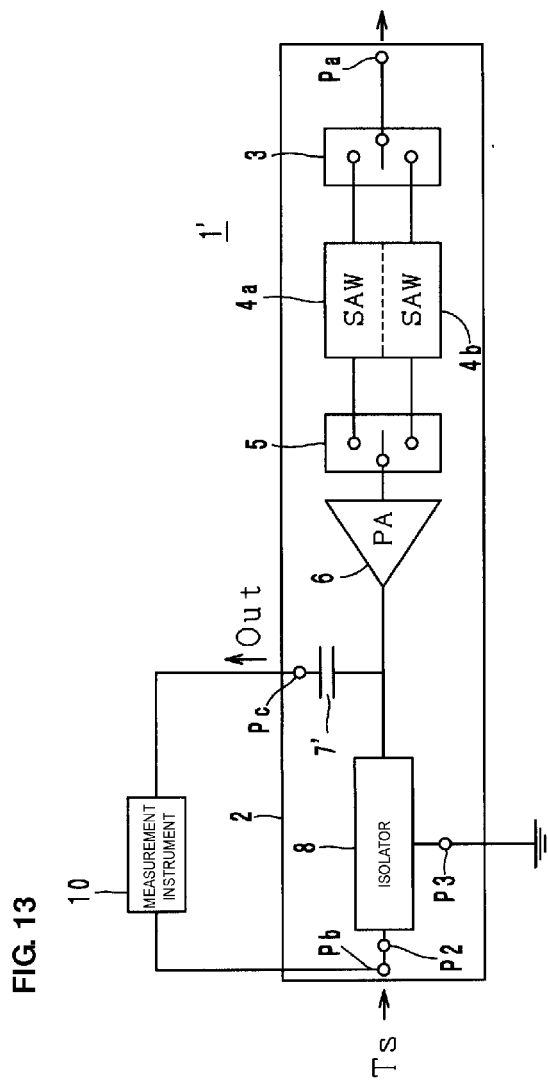
FIG. 13 is a block diagram of a circuit module according to a modification at the time when measurement of isolation characteristics of an isolator is being performed.

Hereafter, a circuit module 1' according to a modification of a preferred embodiment of the present invention will be described with reference to the drawings. FIG. 13 is a block diagram of the circuit module 1' according to the modification at the time when measurement of isolation characteristics of the isolator 8 is being performed.

As illustrated in FIG. 13, in the circuit module 1', a capacitor 7' is provided as a distribution circuit instead of the directional coupler 7. The capacitor 7' is connected between a signal line, which connects the power amplifier 6 and the isolator 8, and the terminal Pc. In addition, the measurement instrument 10 is connected between the terminals Pb and Pc when measuring the isolation characteristics of the isolator 8. Thus, also in the circuit module 1', the isolation characteristics of the isolator 8 can be readily measured, similarly to as in the circuit module 1.

As described above, preferred embodiments of the present invention are of use in circuit modules and measurement methods, for example, and are particularly excellent in that, in a circuit module including a processing circuit and an isolator, the isolation characteristics of the isolator can be accurately measured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
 a circuit board;
 a processing circuit provided on the circuit board and arranged to perform processing on an input signal;
 an isolator that is provided on the circuit board and includes an input port, an output port and a ground port, and is arranged to output the input signal that is input thereto via the input port and on which the processing circuit has performed the processing, as an output signal via the output port; and
 a distribution circuit that is provided between the processing circuit and the isolator, and that distributes the input signal transmitted between the processing circuit and the isolator; wherein
 the isolator includes:
  a core isolator that is mounted on the circuit board and includes a ferrite, a permanent magnet that applies a direct current magnetic field to the ferrite, a first central electrode that is provided on the ferrite, includes a first end connected to the input port and a second end connected to the output port, and a second central electrode that is provided on the ferrite so as to intersect the first central electrode while being insulated from the first central electrode and includes a first end connected to the output port and a second end connected to the ground port; and
  a matching circuit that is provided on the circuit board and is arranged to match an input impedance and an output impedance of the isolator to a predetermined impedance.

2. The ciruit modul eaccording to claim 1, wherein the processing circuit includes an amplifier circuit that amplifies power of the input signal.

3. The circuit module according to claim 1, wherein the processing circuit includes a power amplifier that amplifies power of the input signal and the distribution circuit includes a directional coupler.

4. The circuit module according to claim 1, wherein the directional coupler is located between the power amplifier and the isolator.

5. The circuit module according to claim 1, wherein the distribution circuit includes a capacitor connected between a signal line that connects a power amplifier and the isolator and a terminal.

6. The circuit module according to claim 1, wherein the processing circuit includes a circuit arranged to allow a signal of a predetermined frequency band to pass therethrough, and the isolator has characteristics in which, when input with a first signal from the output port, attenuation of a second signal output from the input port with respect to the first signal is maximum at a frequency outside the predetermined frequency band.

7. The circuit module according to claim 6, wherein the processing circuit includes a plurality of processing circuits arranged along signal paths and the plurality of processing circuits have characteristics of allowing signals of predetermined frequency bands that are different from each other to pass therethrough, and when the first signal is input from the output port of the isolator, the frequency at which attenuation of the second signal output from the input port with respect to the first signal is a maximum is in a frequency band between the predetermined frequency bands of the plurality of processing circuits.

8. The circuit module according to claim 1, wherein the distribution circuit includes a directional coupler.

9. The circuit module according to claim 8, wherein the directional coupler includes a main line and a sub-line, which are insulated from each other, and the main line and the sub-line are connected to the amplifier circuit.

10. A measurement method for measuring characteristics of an isolator of a circuit module, the circuit module including a processing circuit that performs processing on an input signal, the isolator including an input port, an output port and a ground port and that outputs the input signal input thereto via the input port and on which the processing has been performed by the processing circuit, as an output signal via the output port, and a distribution circuit that is provided between the processing circuit and the isolator and distributes a signal transmitted between the processing circuit and the isolator, the method comprising:

a first step of inputting a test signal from the output port and measuring a detection signal output from the distribution circuit.

11. The measurement method according to claim 10, further comprising a second step of adjusting the characteristics of the isolator based on a measurement result of the detection signal.

12. The measurement method according to claim 10, wherein
the circuit module further includes a circuit board; and
the isolator includes:
a core isolator that is mounted on the circuit board and includes a ferrite, a permanent magnet that applies a direct current magnetic field to the ferrite, a first central electrode that is provided on the ferrite and includes a first end connected to the input port and a second end connected to the output port, and a second central electrode that is provided on the ferrite so as to intersect the first central electrode while being insulated from the first central electrode and includes a first end connected to the output port and a second end thereof connected to the ground port; and
a matching circuit that is provided on the circuit board and is arranged to match an input impedance and an output impedance of the isolator to a predetermined impedance.

13. The measurement method according to claim 10, wherein the first step includes measuring attenuation of the detection signal with respect to the test signal.

14. The measurement method according to claim 10, wherein the processing circuit includes a circuit arranged to allow a signal of a predetermined frequency band to pass therethrough, and the isolator has characteristics in which, when input with a first signal from the output port, attenuation of a second signal output from the input port with respect to the first signal is maximum at a frequency outside the predetermined frequency band.

15. The measurement method according to claim 10, wherein the processing circuit includes an amplifier circuit that amplifies power of the input signal.

16. The measurement method according to claim 10, wherein the processing circuit includes a power amplifier that amplifies power of the input signal and the distribution circuit includes a directional coupler.

17. The measurement method according to claim 10, wherein the directional coupler is located between the power amplifier and the isolator.

18. The measurement method according to claim 10, wherein the distribution circuit includes a capacitor connected between a signal line that connects a power amplifier and the isolator and a terminal.

19. The measurement method according to claim 10, wherein the distribution circuit includes a directional coupler.

20. The measurement method according to claim 19, wherein the directional coupler includes a main line and a sub-line, which are insulated from each other, and the main line and the sub-line are connected to the amplifier circuit.

* * * * *